United States Patent
Kolis et al.

(10) Patent No.: US 10,942,381 B2
(45) Date of Patent: Mar. 9, 2021

(54) FARADAY ROTATORS OF TERBIUM OXYHYDROXIDE

(71) Applicant: Clemson University, Clemson, SC (US)

(72) Inventors: Joseph William Kolis, Central, SC (US); Duminda Sanjeewa, Clemson, SC (US); Kyle Fulle, Anderson, SC (US)

(73) Assignee: Clemson University of Research Foundation, Clemson, SC (US)

( * ) Notice: Subject to any disclaimer, the term of this patent is extended or adjusted under 35 U.S.C. 154(b) by 136 days.

(21) Appl. No.: 16/034,699

(22) Filed: Jul. 13, 2018

(65) Prior Publication Data
US 2019/0018265 A1    Jan. 17, 2019

Related U.S. Application Data

(60) Provisional application No. 62/532,662, filed on Jul. 14, 2017.

(51) Int. Cl.
*G02B 5/30* (2006.01)
*G02F 1/09* (2006.01)
(Continued)

(52) U.S. Cl.
CPC ............ *G02F 1/093* (2013.01); *C01F 17/206* (2020.01); *C30B 7/10* (2013.01); *C30B 29/22* (2013.01); *G02B 5/3083* (2013.01); *G02B 27/28* (2013.01); *G02B 27/288* (2013.01); *C01P 2002/54* (2013.01); *C01P 2006/42* (2013.01); *C01P 2006/60* (2013.01); *G02B 5/3025* (2013.01)

(58) Field of Classification Search
CPC ... G02B 1/00; G02B 1/08; G02B 5/30; G02B 5/3025; G02B 27/28; G02B 27/283; G02F 1/09; G02F 1/093; G02F 1/0955; H01F 1/165; H01F 1/175; H01F 1/32; H01F 1/375; H01F 1/38; H01F 1/393
USPC ............ 359/483.01, 484.01, 484.02, 484.03, 359/484.04, 484.1; 372/703; 252/582, 252/585, 587
See application file for complete search history.

(56) References Cited

U.S. PATENT DOCUMENTS 5,140,456 A    8/1992  Huber
6,351,331 B1 *  2/2002  Fukuda ................. G02F 1/0036
                                                         117/942
(Continued)

OTHER PUBLICATIONS

"Single Crystal", retreived from Wikipedia, Aug. 26, 2020.*
(Continued)

*Primary Examiner* — Arnel C Lavarias
(74) *Attorney, Agent, or Firm* — Dority & Manning, P.A.

(57) ABSTRACT

Terbium-based Faraday rotators, optical isolators incorporating the Faraday rotators, and methods for forming the Faraday rotators are described. Formation methods include hydrothermal growth methods for forming monolithic single crystals of TbO(OH) as Faraday rotator materials. TbO(OH) can also be used as a starting material in a hydrothermal growth method to form monolithic single crystals of $Tb_x Yb_{(2-x)}O_3$, in which x is between about 0.05 and about 1 or terbium aluminum garnet TAG for use as a Faraday rotator in an optical isolator.

19 Claims, 3 Drawing Sheets

(51) Int. Cl.
  *C30B 29/22* (2006.01)
  *C30B 7/10* (2006.01)
  *G02B 27/28* (2006.01)
  *C01F 17/206* (2020.01)

(56) References Cited

U.S. PATENT DOCUMENTS

| | | | |
|---|---|---|---|
| 7,211,234 B2 | 5/2007 | Kolis | |
| 7,374,616 B2 | 5/2008 | Kolis | |
| 7,540,917 B2 | 6/2009 | Kolis et al. | |
| 7,563,320 B2 | 7/2009 | Kolis et al. | |
| 7,591,896 B2 | 9/2009 | Kolis et al. | |
| 8,625,197 B2 | 1/2014 | Makikawa et al. | |
| 8,753,538 B2* | 6/2014 | Makikawa | C04B 35/50 252/301.4 R |
| 8,834,629 B2 | 9/2014 | Kolis et al. | |
| 9,014,228 B1 | 4/2015 | Kolis et al. | |
| 9,469,915 B2 | 10/2016 | Kolis et al. | |
| 9,493,887 B1 | 11/2016 | Kolis et al. | |
| 9,506,166 B1 | 11/2016 | Kolis et al. | |
| 9,711,928 B2 | 7/2017 | Kolis et al. | |
| 2005/0022720 A1 | 2/2005 | Kolis | |
| 2016/0326667 A1 | 11/2016 | Kolis et al. | |

OTHER PUBLICATIONS

"Grain Boundary", retreived from Wikipedia, Aug. 26, 2020.*
Cava, et al. "The structure of $LaTaO_4$ at 300° C by neutron powder profile analysis" *Journal of Solid State Chemistry* 36(2) (1981) pp. 139-147.
Mann, et al. "Crystal Chemistry of Alkali Thorium Silicates Under Hydrothermal Conditions" *Cryst. Growth Des.* 15 (2015) pp. 2643-2651.
Mann, et al. "Hydrothermal Growth and Thermal Property Characterization of $ThO_2$ Single Crystals" *Cryst. Growth Des.* 10 (2010) pp. 2146-2151.
Nyman, et al. "Aqueous Synthesis and Structural Comparison of Rare Earth Niobates and Tantalates: $(La,K,\_)2Nb2O7-x(OH)2$ and $Ln2Ta2O7 (OH) 2$ (_=vacancy; Ln=La-Sm)" *Chem. Mater.* 21 (2009) pp. 2201-2208.
Nyman, et al. "Unique $LaTaO4$ Polymorph for Multiple Energy Applications" *Chem. Mat.* 21 (2009) pp. 4731-4737.

* cited by examiner

FARADAY ROTATORS OF TERBIUM OXYHYDROXIDE

CROSS REFERENCE TO RELATED APPLICATION

This application claims filing benefit of U.S. Provisional Patent Application Ser. No. 62/532,662 having a filing date of Jul. 14, 2017, which is incorporated herein by reference for all purposes.

STATEMENT REGARDING FEDERALLY SPONSORED RESEARCH OR DEVELOPMENT

This invention was made with government support under grant #DE-SC0014271 awarded by The Department of Energy. The government has certain rights in the invention.

BACKGROUND

It is known that the Faraday effect in magneto-optic materials can be used to provide a non-reciprocal device that can serve as an optical isolator, i.e., a device that permits passage of light in only one direction. Optical isolator materials, commonly referred to as Faraday rotators, generally have magnetic domains, and application of a magnetic field to the material results in change of the domain structure. In a magnetic field greater than or equal to the saturation field, the Faraday rotator will contain essentially a single magnetic domain, with magnetization oriented along the direction of the applied field. Upon removal of the applied field the material reverts to a randomly oriented multi-domain state. In a magnetically saturated Faraday rotator, rotation is experienced by light transmitted through the material.

Faraday isolaters can essentially act as "filters" to prevent feedback in an optical circuit. For instance, in most laser systems a diode serves to pump the laser cavity from ground state to the "population inversion" state whereby the cavity lasers. This is a standard design for many different types of lasers. However a significant problem is that the various laser optics can reflect the pump light back into the diode. The pump diodes are very sensitive to this problem and the feedback can blind them and burn them out. A laser cavity design that is particularly sensitive to this problem is the diode pump fiber lasers that are getting much more common in applications such as cutting, automotive welding and related applications. To minimize the damage to these devices, a Faraday isolator is often inserted at several steps of the laser design to filter out the back reflection light.

A metal ion that can function well in Faraday rotators is Terbium$^{3+}$ (Tb$^{3+}$). Tb$^{3+}$ is not a straightforward material to deal with since it has other stable oxidation states (Tb$^{4+}$), that can cause problems in the rotator. Thus there is a continual search for new Tb$^{3+}$ materials that can behave as Faraday rotators. Among known magneto-optic materials are Bi-substituted rare earth iron garnets such as (Bi$_x$Tb$_{1-x}$)$_3$(Fe$_y$Ga$_{1-y}$)$_5$O$_{12}$. The current industry standard material is called TGG which has the formula Tb$_3$Ga$_5$O$_{12}$. It is commercially available but has several shortcomings. For instance, there is a defect that occurs in the crystals such that it has considerable light absorption in a wavelength range of 500 to 600 nm and appears light brown in color, and as such the material cannot be used effectively in certain wavelengths. Another material commonly used as a Faraday rotator is a YIG (yttrium iron garnet) single crystal containing Fe, but such a material has considerable light absorption in the wavelength range of 320 to 800. Therefore, it cannot be used in many applications since an influence of this absorption appears in the certain wavelength range. Attenuating the light in the traveling direction presents additional problems in existing materials, and Faraday rotators having a higher transmission factor of light is more advantageous.

In addition to these issues, common Faraday rotators contain a great deal of gallium which is expensive. Also, as the growth methods used are inefficient, much of the raw starting material is discarded, which also adds to cost, particularly for gallium-containing materials.

What are needed in the art are Faraday rotators and optical isolators incorporating the Faraday rotators that can be formed efficiently and at low cost and that exhibit high transmission over a wide range of wavelengths and temperatures.

SUMMARY

According to one embodiment, disclosed is an optical isolator comprising a Faraday rotator, a first light wave modifier (e.g., a polarizer or a birefringent wedge) adjacent to a first face of the Faraday rotator and a second light wave modifier adjacent to a second, opposite face of the Faraday rotator. The Faraday rotator can include a monolithic, single crystal comprising terbium oxyhydroxide (TbO(OH)) or a terbium-doped ytterbium oxide having the formula Tb$_x$Yb$_{(2-x)}$O$_3$, in which x is between about 0.05 and about 1.

Also disclosed are methods for forming an optical isolator. For instance, a method can include growing a single crystal of TbO(OH) according to a hydrothermal growth process. The hydrothermal growth process can include heating and pressurizing an aqueous solution held within a reactor to develop a temperature differential between a first zone of the reactor and a second zone of the reactor. The aqueous solution containing a mineralizer, the first zone of the reactor containing a TbO(OH) feedstock that provides a terbium source in the first zone. Upon heating and pressurizing the contents of the reactor, growth is initiated and a monolithic single crystal of TbO(OH) can be formed. A method can also include locating a first light wave modifier adjacent a first face of the TbO(OH) crystal and locating a second light wave modifier adjacent a second, opposite face of the TbO(OH) crystal.

According to another method, TbO(OH) can be used as a feedstock for forming a crystal suitable for use as a Faraday rotator. For instance, TbO(OH) that can, in one embodiment, be formed according to a hydrothermal process as described, can be utilized as a feedstock in a hydrothermal growth method in conjunction with other suitable feedstock materials, e.g., a ytterbium source such as Yb$_2$O$_3$ in formation of Tb$_x$Yb$_{(2-x)}$O$_3$, or an aluminum source such as sapphire ($\alpha$-Al$_2$O$_3$) in formation of terbium aluminum garnet (Tb$_3$Al$_5$O$_{12}$; TAG). The formed crystal can then be combined with light wave modifiers in formation of an optical isolator.

BRIEF DESCRIPTION OF THE DRAWINGS

The accompanying drawings illustrate embodiments of the present invention and, together with the description given herein, serve to describe principles of the invention.

DETAILED DESCRIPTION

Figure 1:
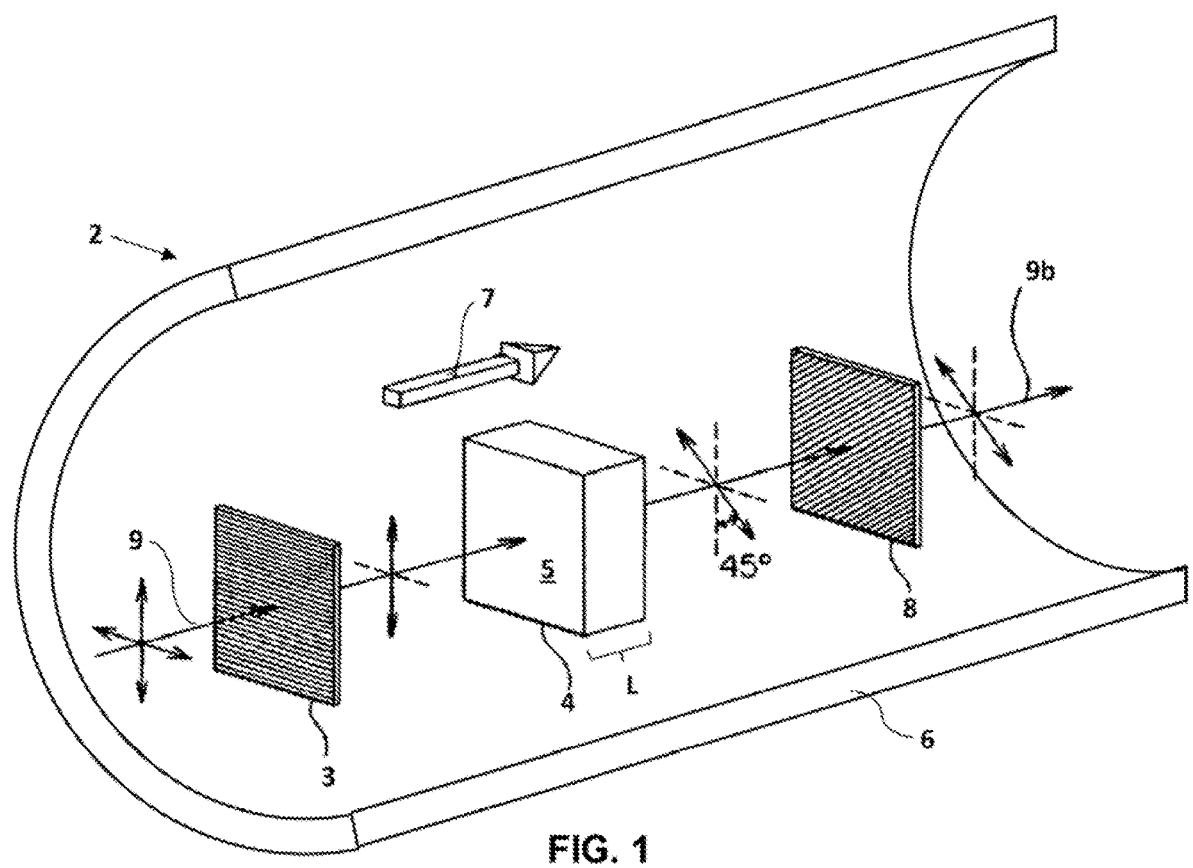
FIG. 1 schematically illustrates one embodiment of an optical isolator as disclosed herein.

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

The present disclosure is directed to terbium-based Faraday rotators, optical isolators incorporating the Faraday rotators, and methods for forming the Faraday rotators. More specifically, disclosed formation methods can include hydrothermal growth methods for forming monolithic single crystals of terbium-based magneto-optic materials suitable for use as Faraday rotators. Disclosed methods can provide a route to optical isolators that include magneto-optic materials such as TbO(OH) or $Tb_xYb_{(2-x)}O_3$, in which x is between about 0.1 and about 1, which have not previously been utilized in such an application as well as a route to less expensive approaches for formation high quality crystals of materials such as TAG, which have been known previously for use in formation of optical isolators.

The single crystals can be formed to any suitable size and can exhibit substantially no absorbance in the visible spectrum (i.e., they appear clear to the human eye). During use, the crystals can cause little or no attenuation of light passing through the crystals in the traveling direction. In addition, by use of a hydrothermal growth method, cost efficient crystal growth can be carried out with little or no waste of starting materials.

The Faraday rotation angle Θ through which a Faraday rotator can rotate incoming light when held in a magnetic field can be represented as follows:

$$\Theta = V \times H \times L$$

where V is the Verdet constant, which is a material characteristic of a Faraday rotator that can vary with wavelength and to a certain extent, with temperature; H is the intensity of the applied magnetic field; and L is the length of the Faraday rotator through which the light passes.

The single crystals described herein can have a very high Verdet coefficient, which is the key performance metric of Faraday rotators. TGG, the current industry standard Faraday rotator material, is reported to have a Verdet constant at 632 nm of about 134 rad/T·m, and at 1064 nm of about 40 rad/T·m. In comparison, the Verdet constant of TbO(OH) crystals is calculated to be from about 70 to about 200 at 1064 nm, for instance about 70 rad/T·m at 1064 nm. In general, the higher the value of the Verdet constant, the better. Larger values means that smaller crystals (which generally correlates to reduced costs) can be used for equal performance. Moreover, miniaturization of products has led to demand for smaller optical isolators, with a corresponding decrease in thickness of the Faraday rotator, which provides further incentive for development of Faraday rotators that can exhibit high Verdet constants at the conditions of use.

The Faraday rotators described herein are based upon terbium oxyhydroxide (TbO(OH)). In one embodiment, a Faraday rotator can include a large, single monolithic crystal of TbO(OH). In another embodiment, a Faraday rotator can be formed according to a hydrothermal growth method in which TbO(OH) is utilized as a starting material.

FIG. 1 schematically illustrates an optical isolator 2 as may incorporate the disclosed magneto-optic materials. As shown, the optical isolator 2 includes a Faraday rotator 4 of a terbium-based magneto-optic material. The Faraday rotator 4 has a first face 5, and a length L through which incident light passes. The optical isolator also includes one or more magnets 6 capable of applying a magnetic field 7 in a direction normal to the first face 5. The optical isolator can be placed in optical communication with a source, e.g., a gain medium as described further herein, that can provide electromagnetic radiation 9 of wavelength λ to be incident on the first face 5 after passage through a polarizer 3. While the Faraday rotator 4 of an optical isolator can be formed to any desired size and shape, particularly in light of the hydrothermal growth method as may be utilized in forming the crystals, in one embodiment, a Faraday rotator 4 can have a length L of from about 1 cm to about 10 cm. In addition, the Faraday rotator can generally have a rotational angle Θ of about 45°, for instance a rotational angle of 45±1° when operated at a temperature of from about 20° C. to about 80°.

As illustrated in FIG. 1, when an incident light beam 9 (no polarization) is transmitted through the first polarizer 3, a lateral oscillation component is absorbed by the grating parallel thereto. As a consequence, a longitudinal oscillation component alone is incident to the face 5 of the Faraday element 4. Being applied with a magnetic field 7, the Faraday element 4 rotates a polarization plane of the incident component by an angle of 45° to produce an outgoing light beam 9b, of which a component passes through the second polarizer 8 as the emitting light beam of the optical isolator. In a reverse direction, the Faraday element 4 would rotate a polarization plane of a polarization component transmitted through the polarizer 8 by an angle of 45°. The rotated light would then pass through the Faraday rotator and be rotated prior to being incident to the polarizer 3 but this light would be inhibited from passing through the polarizer 3, the polarizer being 90° from the incident radiation.

The Faraday rotator 4 can include a single, monolithic magneto-optic crystal that can be formed according to a hydrothermal growth method. The hydrothermal growth method can form high quality single crystals that do not absorb in the visible spectrum and as such can be "water clear", meaning that they can appear colorless to the human eye. As such, the formation methods can provide TbO(OH), $Tb_xYb_{(2-x)}O_3$, or TAG crystals without defects as are known in commercial TAG and TGG materials. Moreover, a hydrothermal growth method can provide for the formation of large monolithic single crystals, for instance a monolithic single crystal having a dimension of at least 2 mm in at least one direction. As utilized herein, the term "single crystal" is intended to refer to a crystalline material that is substantially free of grain boundaries, e.g., that in one embodiment includes no internal grain boundaries.

Figure 2:
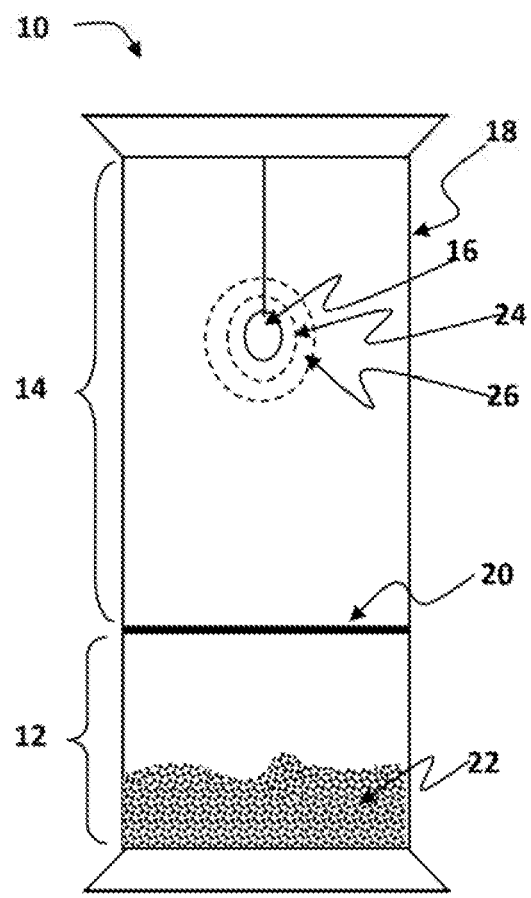
FIG. 2 schematically illustrates one embodiment of a hydrothermal growth system as may be utilized in forming a crystal for use as a Faraday rotator.

FIG. 2 illustrates one embodiment of a hydrothermal system 10 as may be utilized in forming a single crystal Faraday rotator. In general, a hydrothermal process involves the use of a superheated aqueous solution (liquid heated above its boiling point) under pressure (e.g., about 5 kpsi to about 30 kpsi) to cause transport of soluble species of one or more starting materials from a nutrient rich zone 12 to a supersaturated zone 14. As the starting material (generally an oxide) is not sufficiently soluble in the superheated water, the species will crystallize, either spontaneously according to primary nucleation or alternatively on a seed crystal 16 located in the supersaturated zone 14.

A process can generally take place within a reactor 18. Depending on the chemical demands of the specific system, a reactor 18 can be lined with a noble metal such as silver, gold, platinum, etc. For instance, a liner can be a fixed liner or a floating liner. A fixed liner reactor can be in the form of a stand-alone autoclave that is lined with or formed of a desired material and can carry the reactants, products, etc. When utilizing a floating liner, a smaller structure that is lined with or formed of the desired material and containing the reactants can be held or suspended within a larger autoclave. For instance, an autoclave can contain a plurality of smaller tubes, e.g., silver tubes, each of which is loaded with reactants, water, seed crystals, etc. and each of which functions as a floating liner reactor within a larger autoclave. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand-alone autoclave reactor with either fixed liner or unlined can generally be between about 1 cm and about 10 cm in a cross sectional dimension and between about 10 cm and about 100 cm in height. A floating liner reactor can generally be smaller, for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the wall of the reactor 18. For instance, when considering a silver or platinum lined or floating reactor 18, baffle 20 can also be silver or platinum. Baffle 20 can define at least one aperture for passage of solution from the nutrient rich zone 12 to the supersaturated zone 14. A baffle 20 can aid in maintaining a temperature differential between the two zones and can encourage substantially isothermal characteristics in each zone. Baffle 20 can also restrict convective flow between nutrient rich zone 12 and supersaturated zone 14 and can channel the convective flow across the baffle 20 into a desirable geometry.

System 10 can also include heaters, insulators, controllers, etc. as are generally known in the art (not shown on FIG. 1). For instance, a system 10 can include an air space between insulation and the reactor wall. There can also be vents at strategic places to allow air flow to be controlled. Changing vent parameters and power delivered to heaters can determine the thermodynamic condition of the autoclave. Additionally, though illustrated in a vertical arrangement with the nutrient rich zone 12 below the supersaturated zone 14, this is not a requirement of the disclosed process, and the two zones can be located in any suitable location with regard to one another, for instance in a horizontal or any other angled relationship, as long as a temperature differential between the two can encourage convective flow there between.

According to one embodiment, a seed crystal 16 of the desired magneto-optic material can be placed in the supersaturated zone 14 to facilitate crystallization of a dissolved feedstock 22 from a supersaturated solution. Alternatively, no seed crystal be employed, and the formation method can utilize spontaneous growth of single crystals as described. Such spontaneously nucleated crystals typically grow on the side or top of the inert metal lining within the supersaturated zone 14 of the hydrothermal reactor 18.

Included in system 10 can be a feedstock 22 located in the nutrient rich zone 12 of reactor 18. The feedstock can be selected based upon the crystal to be formed. For instance, in one embodiment, the system can be designed for formation of TbO(OH) crystals, and the feedstock 22 can include microcrystalline powder including any suitable terbium source. For instance, a terbium oxide powder including, without limitation, $Tb_4O_7$, $Tb_2O_3$, or $Tb_6O_{11}$ can be utilized.

In another embodiment, TbO(OH) can be a feedstock for forming high purity terbium-based Faraday rotators. In one embodiment, a TbO(OH) feedstock can be provided through initial hydrothermal formation of a TbO(OH) crystal, followed by grinding, pulverizing, or the like to provide a microcrystalline TbO(OH) feedstock. This is not a requirement, however, and in other embodiments a microcrystalline TbO(OH) powder can be provided by other methods or other sources.

The TbO(OH) microcrystalline powder feedstock can be located in the nutrient rich zone in conjunction with other feedstock, which can vary depending upon the particular Faraday rotator material to be formed. In one embodiment, a Faraday rotator of the formula $Tb_xYb_{(2-x)}O_3$, in which x is between about 0.05 and about 1 can be formed, in which case the feedstock can include a suitable ytterbium source such as ytterbium oxide ($Yb_2O_3$). In another embodiment, a TAG Faraday rotator can be formed, in which case the feedstock can include a suitable aluminum oxide feedstock (e.g., $\alpha$-$Al_2O_3$).

The Tb concentration in the formed crystal can be controlled through control of the relative amount of feedstock materials initially located in the nutrient rich zone 12 of the reactor 10. When forming $Tb_xYb_{(2-x)}O_3$, inclusion of higher amounts of TbO(OH) in the nutrient rich zone 12 can attain a higher doping level in the final crystal. For instance, a terbium-doped crystal can be formed in one embodiment including terbium at a relatively high amount, for instance forming a crystal having the formula $TbYbO_3$.

TbO(OH) can generally be provided in a feedstock in a concentration between about 0.1 at. % and about 50 at. %. The concentration of terbium in a crystal region can be controlled very precisely through the addition of appropriate amount of TbO(OH) as feedstock. This control provides for the control of performance characteristics and lattice size. Beneficially, by use of disclosed methods, terbium dopant concentration can be maintained at a constant level throughout growth, rather than at an ever changing concentration throughout growth as in some flux methods. Thus, the formed TAG or $Tb_xYb_{(2-x)}O_3$ crystal can include terbium at a desired constant level throughout the crystal, which can provide an improved lattice structure and performance.

The feedstock 22 can be placed in the reactor 18 in conjunction with an aqueous solution. The aqueous solution used in the hydrothermal process can include a mineralizer that can facilitate dissolution and transport of the feedstock 18 from the nutrient rich zone 12 to the supersaturated zone 14. The identity and concentration of the mineralizer can be an important component of the hydrothermal growth method. Mineralizers are generally small molecules that can dissolve in the superheated fluid at the temperatures and pressures of a formation process and assist in dissolving and transporting the feedstock from a source to nucleation sites where crystal growth can occur.

In forming TbO(OH) crystals, the mineralizer can include KOH at a concentration of from about 1 to about 25 molarity, for instance about 20 M in some embodiments. The mineralizer can include KOH in conjunction with one or more additional mineralizers including, without limitation CsOH, LiOH, NaOH, RbOH, or mixtures thereof, with the total alkali metal hydroxide concentration in the aqueous solution being from about 1 M to about 30 M, and the KOH concentration being from about 1 to about 10 M.

In forming TAG or $Tb_xYb_{(2-x)}O_3$ crystals, the mineralizer can include any suitable material that can contribute one or more small ionic species including but not limited to $OH^-$, $CO_3^{2-}$, $F^-$, $Cl^-$, $NO_3^-$ and $H^+$. Cations of a mineralizer can include but are not limited to alkali ions such as $Li^+$, $Na^+$, $K^+$, $Cs^+$ or $NH_4^+$. A mineralizer can optionally include one or more additional small soluble salt-generating anions and counter-cations. The concentration of a mineralizer used in the process can be similar to that used in forming TbO(OH) crystals, e.g., from about 0.5 M to about 20 M, for instance from about 1 M to about 5 M in some embodiments.

During crystal formation, the superheated hydrothermal fluid can be contained in a reactor under pressure, typically between about 12 kpsi and about 15 kpsi. Growth and supersaturation control is achieved in a process by the use of a differential temperature gradient across a reactor. Referring again to FIG. 2, the nutrient rich zone 12 can be heated and feedstock 22 can dissolve in the hot hydrothermal fluid. The solution in the nutrient rich zone 12 becomes a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build the desired $Tb^{3+}$ containing crystal structure, either on a seed crystal 16 or spontaneously. The process can then continue until stopped or the feedstock supply is consumed.

Among the advantages of a hydrothermal crystal growth process are the relatively low operating temperatures. For instance, a growth process can generally be carried out with temperatures generally below about 700° C., for instance with temperatures within the reactor 18 ranging between about 550° C. and about 750° C., for instance about 650° C. This can simplify operating conditions and drastically minimize the amount of thermal strain regions of a forming crystal. The thermal gradient between the two zones 12, 14 of a reactor 18 can likewise vary according to specific materials and growth rates desired, but typically can be between about 20° C. and about 100° C.

The growth rate of a developing crystal can be between about 1 and about 5 microns per hour, or between about 30 and about 150 microns per day in cross sectional dimension. The growth rates possible can be beneficial as this can allow for precise control of the thickness of the forming crystal. For example, a process can reliably grow a region at about 2 microns/hour or about 25 microns/day and can thus be used to grow a region of about 100 microns over four days.

Disclosed methods can be readily scaled to form more than one crystal simultaneously so time is not a hindering factor to a scale-up of a formation process. Moreover, once a process is started it can require no operator input over the course of the reaction and can be replicated reliably many times. As such, the total time of growth can be of little consequence in the overall production process. Moreover, a hydrothermal process can be utilized to form crystals of various shapes such as rods or disks, for instance depending upon the presence and shape of a seed crystal as well as the specific formation parameters. Typically formed crystals can be several hundred microns to several millimeters thick, though larger or smaller materials can be formed. Beneficially, a hydrothermal method can be utilized for production of crystals in sufficiently large size so as to be able to be cut and as such useful for Faraday rotators. This size is typically in excess of about 3 mm to about 5 mm on any edge.

Following formation, the crystal body can be polished into a piece of the desired dimensions, and the face 5 and opposite face thereof (not visible in FIG. 1) can be finished to optical planes by mirror-finish processing as is known in the art. Optionally, a bi-layered anti-reflection coating of $SiO_2$ and $Al_2O_3$ can be applied onto the optical planes to complete a Faraday rotator.

To form an optical isolator, a Faraday rotator can be combined with polarizers 3, 8 adjacent to each face through which light will travel during use. The polarizers 3, 8 can include, without limitations, polarizing prisms, polarizing glass plates, and the like. In one embodiment, one or both of the polarizers 3, 8 may be made of metallic thin films having a film thickness on the order of about 1000 μm or less that can be formed so as to have narrow bands in a substrate spaced from each other by an interval. In one embodiment, a polarizer can include a glass polarizing plate or a dielectric metal laminated film polarizer. The polarizers 3, 8 may be in the form of a single-step or multi-step type polarizers and may be the same or different from one another.

In one embodiment, thin polarization gratings can be directly attached to the Faraday rotator 4 as polarization elements 3, 8. This arrangement can save space and reduce size and weight of the optical isolator as compared to utilization of two polarization elements of a bulk type.

The polarizer 3 is adjacent to the light incident face 5 of the Faraday rotator 4 and the polarizer 8 is adjacent to the light outgoing face of the Faraday rotator. The polarizers are generally in the form of a unidirectional grating with an interval not greater than one tenth of the wavelength of light expected to be utilized in conjunction with the optical isolator. The polarizer 8 on the light outgoing face forms, in a plane perpendicular to an optical axis, an angle with respect to the polarizer 3 on the light incident face 5, that is generally about 45° and in a direction similar to that of rotation of the polarization plane by the Faraday rotator.

Alternatively, an optical member such as a wavelength plate, e.g., a ½ wavelength plate, may be inserted into the isolator in addition to these components.

Figure 3:
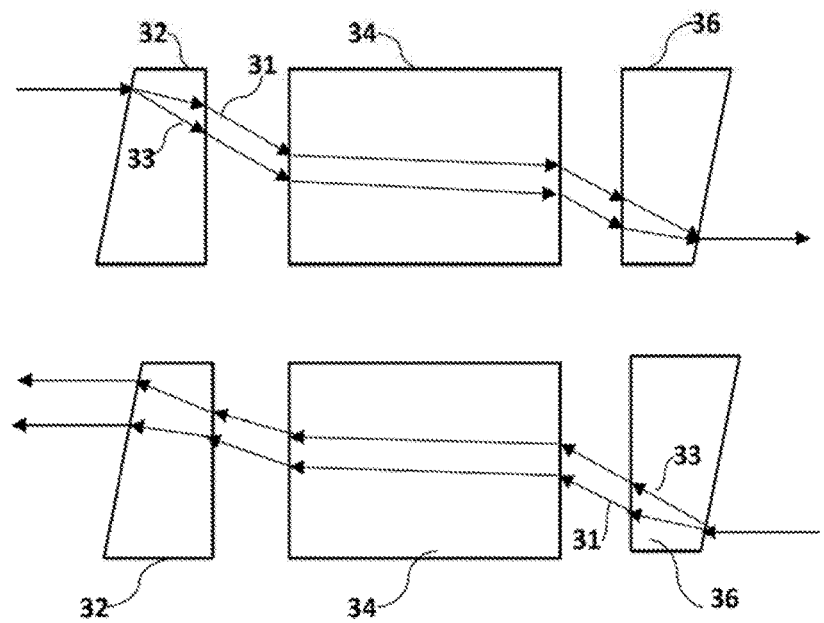
FIG. 3 schematically illustrates one embodiment of a polarization independent optical isolator as disclosed herein.

In one embodiment, the optical isolator can be a polarization independent isolator, an example of which is illustrated in FIG. 3. A polarization independent isolator can generally include an input birefringent wedge 32 with its ordinary polarization direction vertical and its extraordinary polarization direction horizontal, a Faraday rotator 34, and an output birefringent wedge 36 with its ordinary polarization direction at 45°, and its extraordinary polarization direction at −45°.

Light traveling in the forward direction (FIG. 3, top panel) is split by the birefringent wedge 32 into its vertical (0°) and horizontal (90°) components, termed the ordinary ray (o-ray) 31 and the extraordinary ray (e-ray) 33. The Faraday rotator 34 rotates both the o-ray 31 and e-ray 33 by 45°. This means the o-ray is now at 45°, and the e-ray is at −45°. The birefringent wedge 36 then recombines the two components at the exit, as shown. Light traveling in the backward direction (FIG. 3, lower panel) is separated into the o-ray 31 (at 45°), and the e-ray 33 (at −45°) by the birefringent wedge 36. The Faraday rotator 34 again rotates both the rays by 45°. However, upon exit from the Faraday rotator 34 the o-ray 31 is now at 90°, and the e-ray 33 is now at 0°. In this case, instead of being focused, the rays diverge. Collimators are generally included in a polarization independent isolator, and can be located on either side of the isolator between the birefringent wedge 32, 36 and the Faraday rotator 34. In the transmitted direction (FIG. 3, top) the beam can be split at the wedge 32 and then combined and focused into the output collimator. In the isolated direction (FIG. 3, bottom) the beam is split, and then diverged, so it does not focus at the collimator.

Referring again to FIG. 1, an optical isolator can also include a magnet 6, which can include one or more individual magnets and can include permanent magnets (e.g., a cast magnet), or electromagnets. Particular magnets for use can depend upon the specific application, including for instance, upon the wavelength or range of wavelengths with which the Faraday rotator 4 is to be used. Exemplary magnetic materials can include, without limitation, samarium-cobalt (Sm—Co), neodymium-iron-boron (Nd—Fe—B) (which is often utilized for visible and near-infrared wavelengths), a ferrite magnet (e.g., Fe—Al—Ni), or the like.

An optical isolator as described is applicable to, among other things, optical communication, broadcast wave transmission using light, and measurement by light. In addition, it is also possible to use the optical isolator in an optical pickup of an optical disk and so on.

In one embodiment, the optical isolator can be used in various instruments in order to prevent a light wave emitted from a laser as a light source from returning to the light source due to various causes. For instance, an optical isolator can be downstream of a solid-state laser that includes a high-gain laser medium, for instance in the form of a diode pumped rod or slab, among others.

A solid-state laser cavity contains a host material that is doped with a small amount of an activator ion. This ion can be pumped by a light source such as a flash lamp or more commonly, a diode laser of suitable frequency. The light from the pump is absorbed by the gain medium, i.e., the doped host, creating a population inversion that causes stimulated emission of coherent light. The output light can be in the form of continuous or pulsed emission.

While the gain medium can be the only crystal regime of a laser cavity, a solid-state laser can employ several single crystal regimes that serve a series of purposes including thermal management, mechanical strength, waveguiding, and the like.

The optical isolators can be utilized with any gain mediums formed of any material as is known in the art and suitable for use in a lasing methodology including, without limitation, $Y_3Al_5O_{12}$ (YAG), $YVO_4$ and $M_2O_3$ (where M is Sc, Y or Lu), $Lu_3Al_5O_{12}$, $Gd_3Ga_5O_{12}$, $Gd_3Sc_2Ga_3O_{12}$, other garnets, oxides, spinels, perovskites phosphates, vanadates, borates, fluorides and other halides. Activator ion dopants can include essentially all of the suitable trivalent laser active ions including, but not limited to, $Nd^{3+}$ and $Yb^{3+}$, $Er^{3+}$, $Tm^{3+}$, $Ho^{3+}$, and the like. In general, all trivalent lanthanides (La to Yb, Sc and Y) and most other trivalent metal ions with gain active properties can be successfully doped into a YAG lattice using a hydrothermal growth method. Typically, all the rare earths from Ce to Yb can be incorporated into a trivalent host metal site as a dopant. Moreover, a gain medium or a region thereof can include more than one dopant. For instance, a region can be formed of Yb,Er:YAG or Tm,Ho:YAG. Most dopants can be provided to the feedstock as a metal oxide, halide or nitrate.

Optical pumping of a solid-state laser medium is a common and conventional method used to create a population inversion of energy states for laser applications requiring high-gain. To saturate an entire laser medium with an inverted population through optical pumping, a conventional method is to distribute one diode or an array of laser diodes across the surface of the laser medium to form a pumping array. The light emitted from the individual laser diodes of the pumping array excites the laser medium and provide a very high optical gain for the energy transition level of the optically-pumped, inverted population within the high-gain laser medium, e.g., near the 1.064:m range for $Nd^{3+}$:YAG, near the 1.06:m range for $Nd^{3+}$:glass, near the 0.6943:m range for $Cr^{3+}$:$Al_2O_3$, near the 1.55:m range for $Er^{3+}$:silica, etc.

Figure 4:
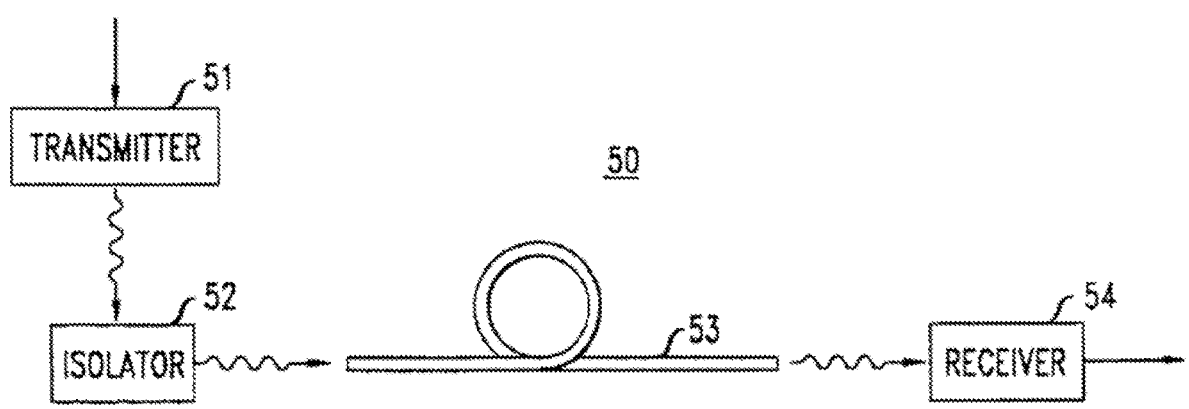
FIG. 4 schematically illustrates an optical fiber communications system as may incorporate an optical isolator as disclosed herein.

Those skilled in the art will know that the optical isolators (polarization-dependent or -independent) can also be used in conjunction with optical fiber amplifiers (see, for instance, U.S. Pat. No. 5,140,456, which is incorporated herein by reference) or other components of an optical fiber communication system (e.g., in conjunction with a conventional wavelength division multiplexer or coupler). All such uses are contemplated. For instance, an isolator is typically placed near the transmitter laser to protect the laser against reflected signal radiation. FIG. 4 schematically depicts an optical fiber communication system 50, that can include a transmitter 51, optical isolator 52, optical fiber 53, and receiver 54. It will be appreciated that the system can be conventional, except for the use of the isolator according to the disclosure.

Embodiments of the subject matter have been described using specific terms and devices. The words and terms used are for illustrative purposes only. The words and terms are words and terms of description, rather than of limitation. It is to be understood that changes and variations may be made by those of ordinary skill art without departing from the spirit or scope of the invention, which is set forth in the following claims. In addition it should be understood that aspects of the various embodiments may be interchanged in whole or in part. Therefore, the spirit and scope of the appended claims should not be limited to descriptions and examples herein.

What is claimed is:

1. An optical isolator comprising:
   a Faraday rotator, the Faraday rotator comprising a single, monolithic crystal comprising terbium oxyhydroxide, the Faraday rotator including a first face and a second opposite face;
   a first light wave modifier adjacent the first face of the Faraday rotator; and
   a second light wave modifier adjacent the second face of the Faraday rotator.

2. The optical isolator of claim 1, wherein the first and second light wave modifiers are first and second polarizers or are first and second birefringent wedges.

3. The optical isolator of claim 2, wherein the first and second polarizers are independently polarizing prisms, polarizing glass plates, or polarizing thin films.

4. The optical isolator of claim 1, wherein the single, monolithic crystal has substantially no absorbance in a visible spectrum.

5. The optical isolator of claim 1, wherein the Faraday rotator has a Verdet constant of from about 20 rad/T·m to about 200 rad/T·m at 1064 nm.

6. The optical isolator of claim 1, wherein the Faraday rotator has a length along a light path of from about 1 cm to about 10 cm.

7. The optical isolator of claim 1, further comprising an anti-reflection coating on the first face and the second face.

8. A method for forming the optical isolator of claim 1 comprising:
heating and pressurizing an aqueous solution held within a reactor to develop a temperature differential between a first zone of the reactor and a second zone of the reactor, the aqueous solution containing a mineralizer, the first zone of the reactor containing a terbium source, wherein upon the heating and pressurizing, growth of the monolithic crystal comprising terbium oxyhydroxide is initiated in the second zone of the reactor;
locating a first light wave modifier adjacent a first face of the monolithic crystal comprising terbium oxyhydroxide; and
locating a second light wave modifier adjacent a second opposite face of the monolithic crystal comprising terbium oxyhydroxide.

9. The method of claim 8, further comprising cutting the crystal and/or polishing the first and second faces of the crystal prior to locating the first and second light wave modifiers adjacent the first and second faces of the terbium oxyhydroxide crystal.

10. The method of claim 8, further comprising locating a seed terbium oxyhydroxide crystal in the reactor prior to the heating and pressurizing.

11. The method of claim 8, wherein the terbium source comprises one or more of $Tb_4O_7$, $Tb_2O_3$, or $Tb_6O$.

12. The method of claim 8, wherein the mineralizer comprises potassium hydroxide at a concentration of from about 1 M to about 20 M.

13. The method of claim 8, wherein the aqueous solution is pressurized to a pressure between about 12 kpsi and about 15 kpsi and is heated to a temperature between about 550° C. and about 750° C.

14. A method for forming the optical isolator of claim 1 comprising:
heating and pressurizing an aqueous solution held within a reactor to develop a temperature differential between a first zone of the reactor and a second zone of the reactor, the aqueous solution containing a mineralizer, the first zone of the reactor containing terbium oxyhydroxide, wherein upon the heating and pressurizing, growth of the monolithic crystal comprising terbium oxyhydroxide is initiated in the second zone of the reactor;
locating a first light wave modifier adjacent a first face of the monolithic crystal comprising terbium oxyhydroxide; and
locating a second light wave modifier adjacent a second opposite face of the monolithic crystal comprising terbium oxyhydroxide.

15. The method of claim 14, the first zone comprising the terbium oxyhydroxide in a concentration between about 0.1 at. % and about 50 at. %.

16. The method of claim 14, the first zone further containing an aluminum source.

17. The method of claim 14, further comprising cutting the crystal and/or polishing the first and second faces of the crystal prior to locating the first and second light wave modifiers adjacent the first and second faces of the crystal.

18. The method of claim 14, further comprising locating a seed crystal in the reactor prior to the heating and pressurizing.

19. The method of claim 14, wherein the aqueous solution is pressurized to a pressure between about 12 kpsi and about 15 kpsi and is heated to a temperature between about 550° C. and about 750° C.

* * * * *